United States Patent [19]

Osaki et al.

[11] Patent Number: 4,581,575
[45] Date of Patent: Apr. 8, 1986

[54] METHOD AND APPARATUS FOR MEASURING ORIENTATION OF CONSTITUENTS OF WEBS OR SHEETS

[75] Inventors: Shigeyoshi Osaki, Hyogo; Yoshihiko Fujii, Osaka; Osamu Tomita, Osaka; Kazuhiko Saiwai, Osaka, all of Japan

[73] Assignee: Kanzaki Paper Manufacturing Co., Ltd., Ginza, Japan

[21] Appl. No.: 615,379

[22] Filed: May 30, 1984

[30] Foreign Application Priority Data

Jun. 3, 1983 [JP] Japan .................................. 58-99714

[51] Int. Cl.[4] ............................................ G01R 27/04
[52] U.S. Cl. .......................... 324/58.5 A; 324/58.5 R; 324/58.5 C; 73/159
[58] Field of Search ................................. 73/159, 160; 324/58.5 R, 58.5 A, 58.5 B, 58.5 C

[56] References Cited

U.S. PATENT DOCUMENTS

| | | | |
|---|---|---|---|
| 3,532,973 | 10/1970 | Feinstein | 324/58.5 B |
| 4,087,746 | 5/1978 | Kanae | 324/58.5 B |
| 4,211,970 | 7/1980 | Fitzky | 324/58.5 A |
| 4,297,874 | 11/1981 | Sasaki | 324/58.5 C |
| 4,344,030 | 8/1982 | Anderson | 324/58.5 B |
| 4,500,835 | 2/1985 | Heikkila | 324/58.5 R |

FOREIGN PATENT DOCUMENTS

| | | | |
|---|---|---|---|
| 211856 | 11/1968 | U.S.S.R. | 324/58.5 B |
| 244438 | 5/1969 | U.S.S.R. | 324/58.5 A |
| 245439 | 6/1969 | U.S.S.R. | 324/58.5 A |

OTHER PUBLICATIONS

Tiuri: "Microwave Method for Measurement of Fiber Orientation in Paper"—4th European MW Conference—Sep. 1974—pp. 137–140.
Fiber Orientation and Squareness of Paper (Zero-Span Tensile Strength), TAPPI Standard T 481 sm-60, suggested method—1952, revised—1960.

Primary Examiner—Reinhard J. Eisenzopf
Assistant Examiner—Jose M. Solis

[57] ABSTRACT

A method and apparatus for measuring the orientation of the constituents of sheets are disclosed. The method comprises the steps of inserting a sheet into a small clearance with which the openings in a pair of waveguides are opposed to each other to form a cavity resonator, producing a relative motion at a constant speed between the sheet and the resonator while emitting linearly polarized microwaves from the upper waveguide to allow them to fall on the sheet at right angles thereto, measuring the amount of attenuation of the microwaves by the lower waveguide, and determining the orientation of the constituent of the sheet from that angle of the sheet with respect to the plane of polarization of the microwaves which gives the maximum attenuation.

11 Claims, 10 Drawing Figures

LONGITUDINAL AXIS

SAMPLE STRIPS

LONGITUDINAL AXIS

SAMPLE STRIPS

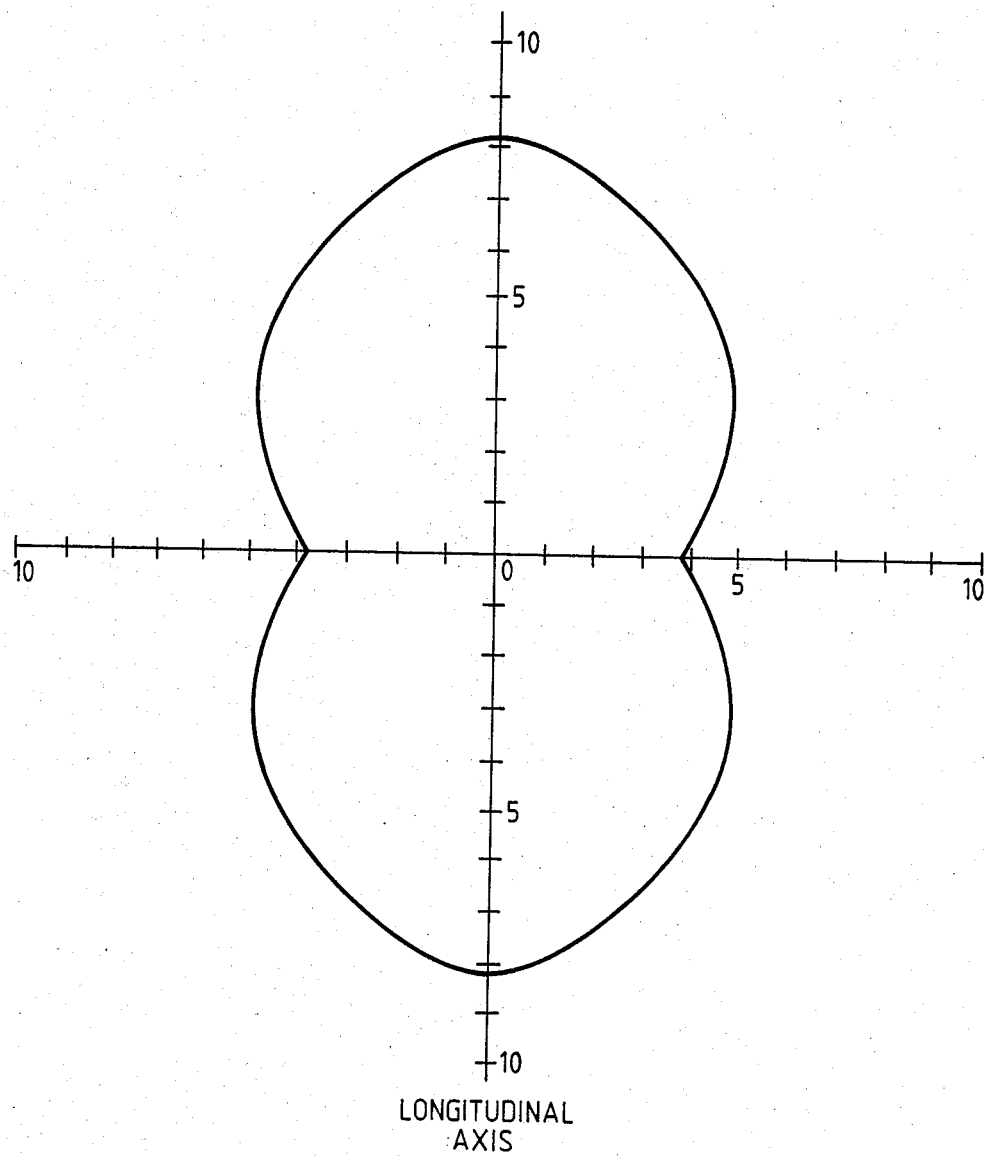

METHOD AND APPARATUS FOR MEASURING ORIENTATION OF CONSTITUENTS OF WEBS OR SHEETS

TECHNICAL FIELD

The present invention relates to a method and apparatus for measuring the orientation of the constituents of webs or sheets.

BACKGROUND ART

The orientation of the constituents of webs or sheets should be of such a degree and direction as are suited to their intended use. Therefore, the orientation of the constituents of sheets or the like should be suitably and readily checked up during or after production.

For example, in the case of a fiber sheet such as paper, to obtain a high quality it is important to disperse fibers sufficiently to obtain as low as concentration as possible and then screen them for paper making. However, the viscosity force of paper stock developed when the stock is spouted at high speed from the head box or the dragging force exerted on the paper stock by the wire cloth, on which it is carried, traveling at a speed almost equal to the flow rate of stock causes the fibers to be oriented in the direction of flow, thus producing differences in paper strength and gloss between longitudinal and transverse directions. Particularly, if during operation the operator makes a mistake in setting the slice flow collision position, the positional relation between the breast roll, wire cloth and forming board or other operating conditions, abnormally varient orientations of fibers take place, imparting a great deal of anisotropy to the paper, which, in turn, forms a cause of frequent break of paper at the wet end or marked ununiformity of coating color profile when a coating color is applied to the paper by a coater.

Further, in the phase of final product, since dimensional changes due to variations in the humidity of the atmosphere are irregular, curls and wrinkles are formed.

Conventionally, to detect such abnormality of fiber orientation in its early stage, a sample of paper is taken at the reel part of the paper making machine as soon as the paper roll is wound up and the sample is tested for the presence or absence of abnormality of fiber orientation as by measurement of zero-span tensile strength (TAPPI, STD, T 481 sm-60), ultra-sonic method, X-ray diffraction method, or viscoelectricity spectroanalysis. Such methods, however, involve a troublesome procedure for setting a sample strip such as a sheet or a sample portion in the measuring mechanism and take a long time in ascertaining the abnormality of fiber orientation. Thus, if there is an abnormality, a large amount of reject would be produced until the completion of a check of fiber orientation over the entire width of the machine, particularly a modern machine which has been sped up and increased in width.

Plastic sheets will now be considered. In the production of plastic sheets, a non-stretched sheet is produced either by the tubular film process in which the sheet material is first heated or frictionmelted to be given fluidity and then extruded into a cylindrical form, into which air is blow to inflate it and at the same time is externally cooled for solidification or by the T-die process in which the melt is extruded into a smooth thin film form and then cooled for solidification in a water tank or on a cooling drum. However, such non-stretched sheet is too inferior in such mechanical strengths as tensile strength, impact strength and tear strength and in processability to be used as such. Thus, to obtain a sheet of good quality, the non-stretched sheet is heated to a suitable temperature above its softening point or below its melting point and subjected to uniaxial or biaxial stretching to improve its physical properties. In such stretching process, it does not necessarily follow that simple mechanically stretching the nonstretched sheet provides a sheet of good quality, but it is necessary that the stretching be performed to provide a particular orientation of molecules to agree with the intended use of the sheet product.

Further, a consideration will be given to a ceramic sheet. In production, a fine ceramic powder is mixed with a binding agent and a lubricant to produce a slip, which is then poured onto a continuously traveling tape of polyethylene or Teflon, and after the thickness of the slip layer on the tape is adjusted as by a doctor, it is fired and finished, the process being called the tape casting forming method, whereby a ceramic sheet in thin film form is obtained. Such thin film-like ceramic sheets are used as a material for laminated ceramic capacitors, for example, by laminating them alternately with electrodes. For the application of ceramic sheets to such use, it is of utmost importance from the standpoint of securing the quality of capacitors at high level that the dielectric constant across the width of ceramic sheets be substantially uniform. Therefore, a checkup of widthwise molecular orientation corresponding to dielectric constant must be made so that only those ceramic sheets which are appropriate may be used. Therefore, said plastic films and ceramic films must be tested for their molecular orientation as in the case of fiber sheets. Thus, conventionally, in these sheets, as soon as the roll is wound up at the winder part of said stretching machine or tape casting forming device, a sample is taken and tested for the presence of absence of abnormality of molecular orientation as by elastic modulus measurement, X-ray diffraction method, or infrared absorption spectroanalysis. With these methods, however, there is the same drawback as was previously described in connection with paper sheets, that is, a large amount of reject would be produced before the completion of the checkup of molecular orientation of the sheet product across the entire width of the processing machine.

With the above in mind, we have conducted an intensive study with a view to developing an apparatus which is easy to handle and capable of making measurements in a short time. In this connection, in order to ascertain the orientation state of the constituent, i.e., fibers or molecules of a sheet, we have investigated the use of and experimented with a microwave of a nature attenuating in accordance with the presence of molecules and we have found that if linearly polarized microwaves (hereinafter reffered to as linearly polarized waves) are applied, at right angles, to the sheet surface while relatively rotating the sheet in its plane, the amount of attenuation increases or decreases with the rotative and that the angle at which the maximum amount of attenuation is exhibited coincides with the direction of orientation of fibers or molecules.

In the case of a fiber web or sheet such as paper, the attenuation of microwaves associated with the orientation of fibers takes place not because of the fibers themselves but in that the microwaves are absorbed by $H_2O$ molecules which are contained in the fibers and which have an orientation corresponding to the orientation of fibers. In addition, where the moisture content of fiber sheets is about 15% or above, H₂O molecules which adhered to the fiber surfaces in agreement with the orientation of fibers by hydrogen bond or by capillarity when the moisture content was below said value, begin to adhere to the fibers independently of the orientation of fibers, so that the orientation of H₂O molecules in the fiber sheet is decreased to a marked degree. For this reason, the method of the present invention is applied to fiber sheets whose moisture content is less than 15%.

The principle of the invention, in a sample model based on the following equation, is supported by the assumption that where fibers or molecules of a sheet are oriented at an angle $\theta$ from the x-axis, the amount of attenuation is at a maximum in a plane of polarization of microwaves where $\theta = \phi$.

$$\Delta w = C_1 \frac{N \pi^2 \cos^2(\theta - \psi)}{kT} + C_2$$

$\Delta W$: Amount of attenuation of microwaves
N: Number of molecules per unit volume, those molecules being capable of microwave-induced movement and including H₂O molecules contained in fibers; hereinafter the same
$\mu$: Effective dipole moment of molecules
$\theta$: Angle between dipole moment of molecules and x-axis
$\phi$: Angle of plane of polarization of waves measured counterclockwise from x-axis
k: Boltzman's constant
T: Absolute temperature
$C_1$, $C_2$: Constants.

SUMMARY OF THE INVENTION

The present invention, intended to achieve the aforesaid object, provides a method and apparatus for measuring the orientation of the constituents of web or sheet products by using a cavity resonator composed of a pair of waveguides having in their bottoms a transmitting antenna and a receiving antenna, respectively, and opposed at their openings to each other with a small clearance defined therebetween, said method comprising the steps of:
inserting a sample portion of said web or sheet product into said small clearance,
emitting linearly polarized microwaves from said transmitting antenna toward said open ends to allow them to fall on the surface of said sample portion at right angles thereto while producing a relative motion betwen the plane of polarization of microwaves and said sample portion around the axis of said cavity resonator,
receiving the microwaves guided from the waveguide disposed on the transmitting side via the sample portion in said clearance to the waveguide disposed on the receiving side so as to find the amount of microwaves absorbed by said sample portion, and
determining the orientation of the constituents of said web or sheet product from the angular position of said sample portion, where said amount of absorption is at a maximum, relative to said plane of polarization.

BRIEF DESCRIPTION OF THE DRAWINGS

FIG. 10 is a closed curve diagram obtained when the orientation of the molecules of a ceramic sheet made of alumina silicate is measured.

BEST MODE FOR CARRYING OUT THE INVENTION

Figure 1:
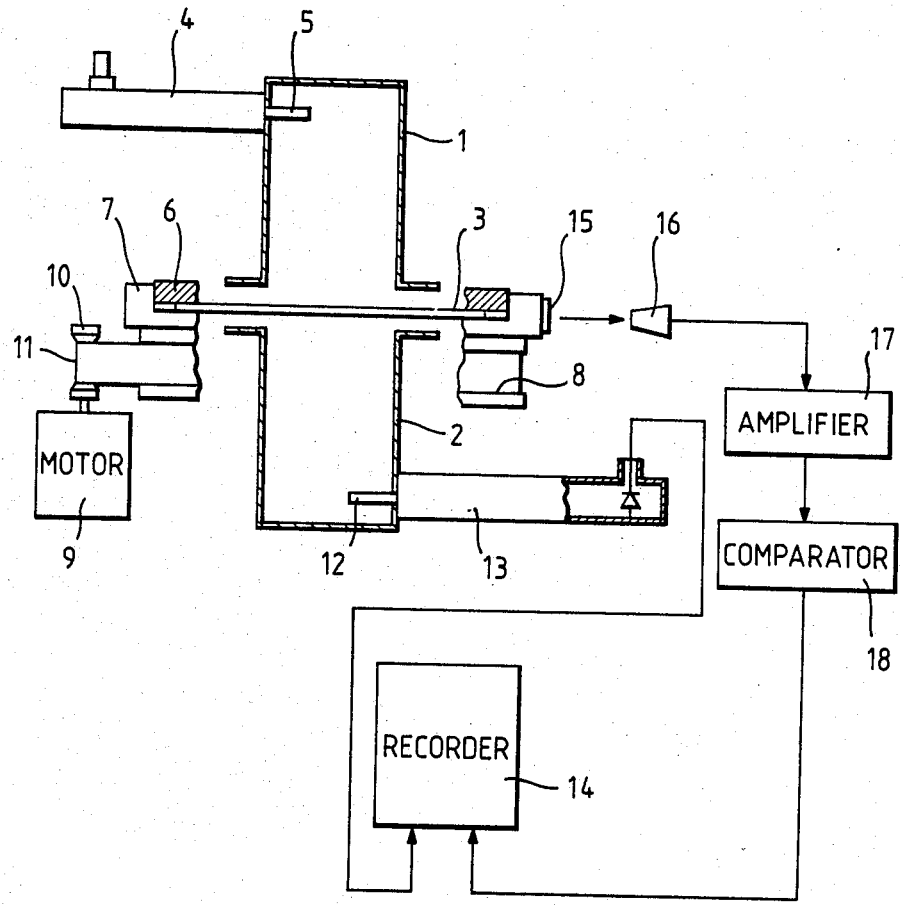
FIG. 1 is a diagram schematically showing an apparatus constructed to measure the orientation of the constituents of sheets according to the method of the present invention.

The apparatus for carrying out the method of the present invention will now be described in detail with reference to the drawings. FIG. 1 schematically shows an embodiment of an apparatus used in the sheet orientation measuring method according to the invention. The numeral 4 denotes an oscillator which emits linearly polarized microwaves of 3 GHz, for example. The microwaves are emitted from an emitting antenna 5 so that they fall on the surface of a sheet 3 always at right angles thereto. In addition, microwaves which are usable are in the range of hundreds of MHz to 100 GHz, but since attenuation due to the rearrangement of the molecules (including H₂O molecules) of sheets takes place more readily in the vicinity of 3-5 GHz, it is more preferable to use microwaves of about 1-50 GHz including that portion. As for sheets to be measured, mention may be made of fiber webs and sheets such as paper and cloth, plastic sheets such as are made of polyethylene, polyoxymethylene, polyvinyl chloride, polyvinylidene fluoride, polyethylene terephthalate, polyamides, polyimides, or copolymers of their and other polymers, and ceramic sheets such as are made of alumina, alumina silicate, barium titanate, titanium oxide, silicon carbide, or strontium titanate. In addition, since microwaves tend to be attenuated more strongly when molecules have polarity, those of said sheets which have polar groups in their molecules can be efficiently measured. As for samples, those in the form of circles or quadrangles larger than the flange of an upper waveguide 1 are used. To retain such sheet 3 in a clearance defined between the upper waveguide 1 and a lower waveguide 2, a sheet fixing block 7 or the like having a keep ring plate 6 in the upper groove section is installed.

To rotate the sheet fixing block 7 with the sheet fixed thereon at a fixed speed, there is employed a method in which for example as shown in FIG. 1, a drive belt 11 is entrained in a belt drive groove 8 formed in the lateral lower portion of the sheet fixing block 7 and in a groove in a drive pulley 10 and a variable speed motor 9 is driven. The linearly polarized microwaves attenuated by the molecules in the sheet 3 are received by a receiving antenna 12 after they have passed through the lower waveguide 2, and then they are converted into electric signals. Such electric signals are demodulated by a detector 13 and then recorded by a recorder 14.

Figure 2:
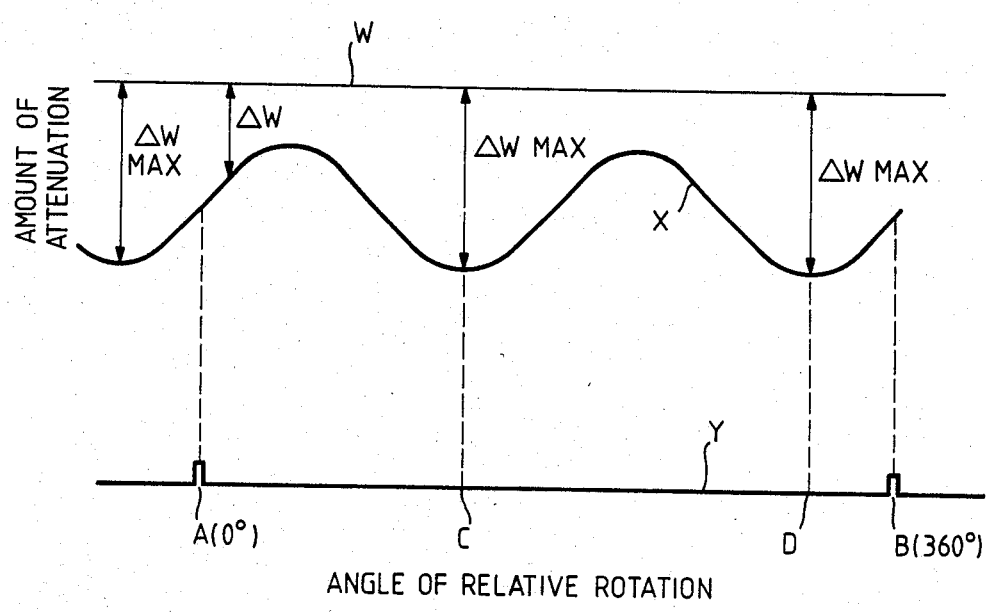
FIG. 2 is a graph showing a microwave attenuation-angle characteristic which forms the basis of determination of orientation recorded on a chart in the recording section of the apparatus shown in FIG. 1.

The detected output curve recorded on the chart in the recorder is as shown at X in FIG. 2. To provide a rotative angle reference for this detected output curve X, for example as shown in FIG. 1, a narrow reflecting tape 15 is applied to a place on the lateral surface of the sheet fixing block 7 so that variations in reflectance of monitor light are detected during rotation by an optical sensor 16 and the resulting electric signals are transferred via an amplifier 17 and a comparator 18 to the recorder 14, whereby they are recorded on the chart as shown at Y in FIG. 2. In addition, since the transverse or longitudinal direction of the sheet is known in advance, the sheet 3, when attached to the sheet fixing block 7, is positioned so that for example the upstream side of the longitudinal direction is the direction of the reflecting tape 15. As a result of this arrangement, since the angle of the peak A or B of the optical sensor signal Y in FIG. 2 always indicates the upstream side of the longitudinal direction, the angle of such peak can be used as the reference angle. Further, since the distance from the peak A to the next peak B represents one revolution of the sheet, it is 360°. Therefore, since the direction of molecular orientation is associated with the angle at which the attenuation of the detected output curve X is at a maximum, as described above, C and D in FIG. 2 correspond thereto and the angle from the reference can be found by computation.

Figure 3:
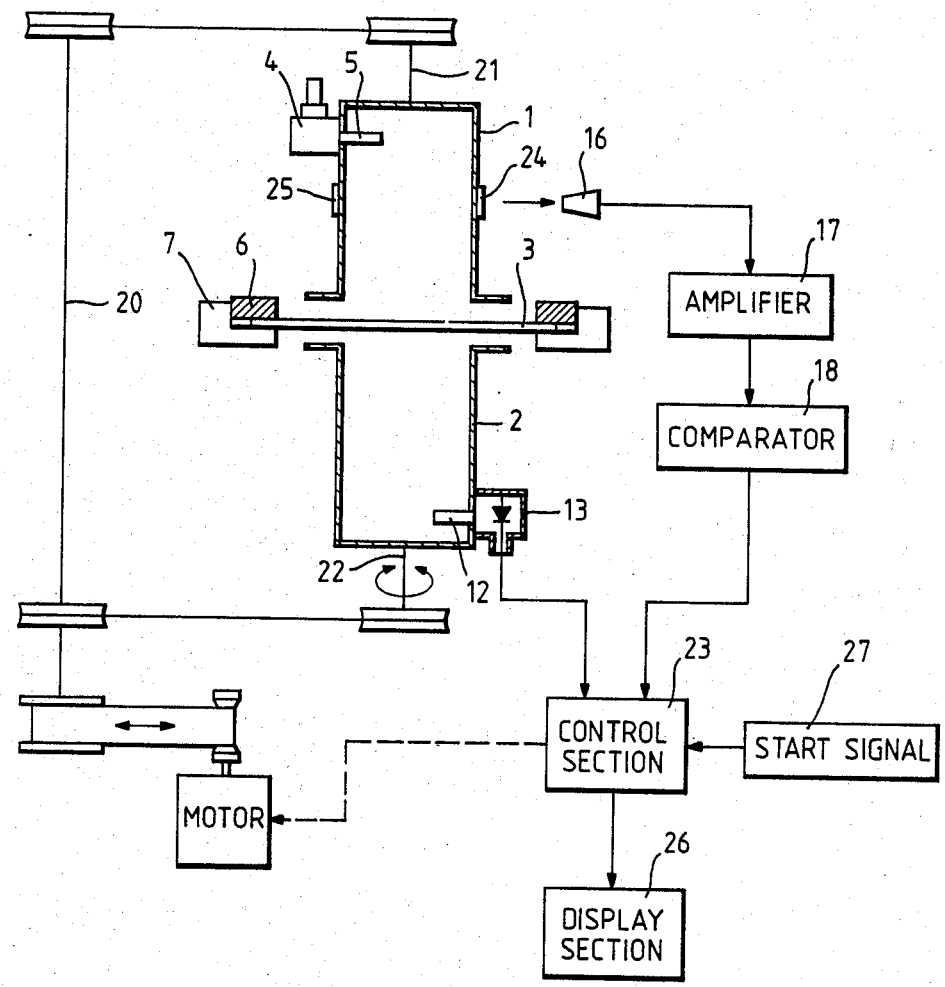
FIG. 3 is a diagram showing another embodiment of an apparatus of the invention for determining the orientation of the constituents of sheets.

An embodiment shown in FIG. 3 is the same as that shown in FIG. 1 in that the sheet 3 is fixed on the sheet fixing block 7 by the keep ring plate 6 and is held between the upper and lower waveguides 1 and 2, but it differs in that the waveguides 1 and 2 can be rotated while the sheet 3 is kept fixed without being rotated. The synchronous rotation of the upper and lower waveguides 1 and 2 is achieved, as shown in FIG. 3, by connecting a reversible motor 19, a drive shaft 20, and waveguides main shafts 21 and 22 by means of belts. In addition, it is desirable that the angle of rotation of the waveguides be set at a value greater than the angle of 180° needed for measurement, and the initial waiting angle and the next waiting angle can be defined by installing optical sensors, limit switches or the like for detecting the angles, at suitable positions.

While FIG. 3 shows the method of rotating the waveguides by using pulleys and belts, depending upon the objective there may be employed a method of directly rotating the plane of linear polarization as by connecting separate electric motors directly to the ends of the waveguides or applying a magnetic field to the upper waveguide.

The linearly polarized microwaves attenuated by the molecules in the sheet 3, after passing through the lower waveguide 2, is received by the receiving antenna 12 and then converted into electric signals. Such electric signals are demodulated by a detector 13 and transferred to a control section 23.

To provide a rotative angle reference for this received output, for example, as shown in FIG. 3, narrow reflecting tapes 24 and 25 are applied, 180° apart, to two places on the lateral surface of the upper waveguide 1 so that variations in reflectance of monitor light are detected during rotation by an optical sensor 16 and the resulting electric signals are transferred via an amplifier 17 and a comparator 18 to a control section 23. In addition, since the transverse or longitudinal direction of the sheet is known in advance, the sheet 3, when attached to the sheet fixing block 7, is positioned so that for example the upstream side of the longitudinal direction is the direction of the reflecting tape 24. As a result of this arrangement, when the signal from the reflecting tape 24 is transferred from the optical sensor 16, it always indicates the upstream side of the longitudinal direction, so that such angle can be used as the reference angle.

Measurements is started when a measurement start signal enters the control section 23. The control section 23, on the basis of a program inputted thereinto in advance, emits a forward rotation start signal to the reversible motor 19, so that the two waveguides 1 and 2 start rotating in the forward direction from the initial waiting angle. The control section 23 soon receives from the optical sensor 16 a signal indicating that the reflecting tape 24 has passed by, and it stores this signal as the measurement start angle and thereafter it also receives a signal notifying the passage of the reflecting tape 25 and stores this signal as the measurement termination angle and emits an operation stop signal to the reversible motor 19, stopping the waveguides 1 and 2 at the next waiting angle. The control section 23 computes the received resonance output values corresponding to the individual angles of rotation inputted thereinto from the detector 13 during the internal from measurement start angle to measurement stop angle, and according to the need it delivers its output to a display section 26 such as a CRT or an X—Y plotter.

Next, the sample of the sheet fixing block 7 is exchanged and a measurement start signal 27 is inputted again. The control section 23 this time gives a reverse rotation command to the reversible motor 19, causing the waveguides 1 and 2 to follow the course which is reverse to the previous one, so that the waveguides 1 and 2 are brought back to the initial waiting angle. Thereafter, the aforesaid procedure is repeated a predetermined number of times. In addition, in the case of the reverse rotation, too, the same computing operation is performed and the result is outputted to the display section 26.

Figure 4:
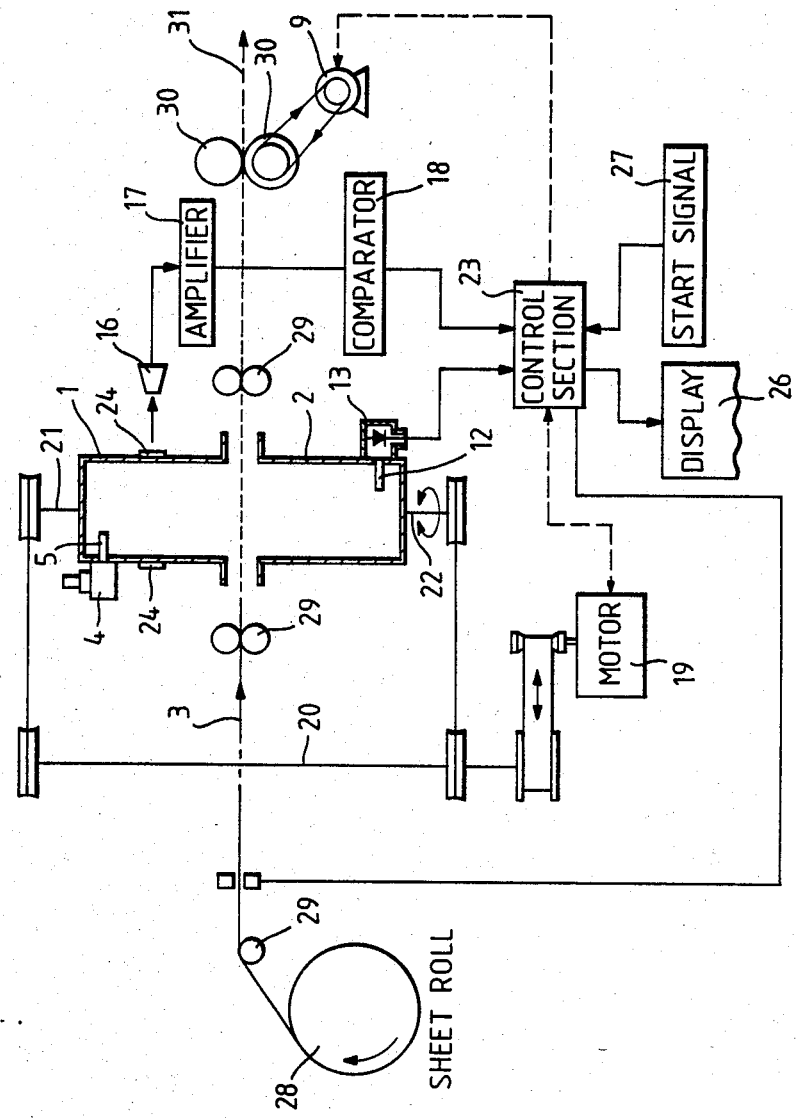
FIG. 4 is a view showing an embodiment of a continuously measuring apparatus, which is a further developed form of the apparatus of FIG. 3.

FIG. 4 shows an embodiment of the invention wherein to observe two-dimensional molecular orientation characteristics of sheets, a narrow sample is taken in the flow direction or width direction from the sheet rool wound up at the reel part and the apparatus of the invention is applied to such sample. In addition, the polarization plane rotating mechanism and the detecting means using an optical sensor are the same as those shown in FIG. 3. A sheet roll 28 of narrow sample is unwound from an unillustrated reel stand and passed over a guide roll 29 and through the nip of sheet feed nip rolls 30. In addition, it is preferable to make it possible to take measurements from the front end of the sheet 3 by providing a lead tape 31 at said front end. Such sheet feed nip rolls 30 are driven by a variable speed motor 9. Further, its operation and stoppage are optionally set by signals from the control section 23.

To describe the image in more detail, the rotative speed of the reversible motor 19 is set to rotate the waveguides 1 and 2 at a required rotative speed, while the amount of rotation and measurement-intended stop time of the sheet feed motor 9 are set to feed the sheet 3 at a required speed. Further, the reflecting tape 24 for the waveguide 1 is set at the initial waiting angle, while the emitting antenna 5 is emitting linearly polarized waves. When a measurement start signal 27 is sent to the control section 23, the latter emits an operation start signal to the sheet feed motor 9 on the basis of the program inputted thereinto in advance, and when the first measuring place reaches the middle between the waveguides 1 and 2, the control section emits an operation stop signal to the sheet feed motor 9 and at the same time it emits a forward rotation start signal to the reversible motor 19, which thereby rotates the waveguides 1 and 2 in the forward direction from the initial waiting angle. When the optical sensor 16 passes by the reflecting tape 25, a forward rotation stop signal is emitted to the reversible motor 19, and the waveguides 1 and 2 are stopped at the next waiting angle. During this time, the control section 23 stores or memorizes as the first-time measured values the amounts of attenuation corresponding to the individual angles in 180° from the amounts of attenuation received by the receiving antenna 12. Subsequently, upon the lapse of the preset stop time, the control section 23 again operates the sheet feed motor 9 to feed sheet 3 and stop the second-time measurement place at the middle between the waveguides 1 and 2, while emitting a backward rotation start signal to the reversible motor 19. This time, reversely to the previous time, the waveguides 1 and 2 are reversely rotated from the waiting angle and the amounts of attenuation corresponding to the individual angles in 180° are stored as the second-time measured values. Thereafter, the same procedures as the above are repeated and the results are computed and outputted to a display section 26 such as a printer, X—Y plotter, or the like.

Examples of measurements of orientation by the method of the present invention will now be concretely described, but it should be noted that the invention is not limited to such examples.

EXAMPLE 1

Figure 5:
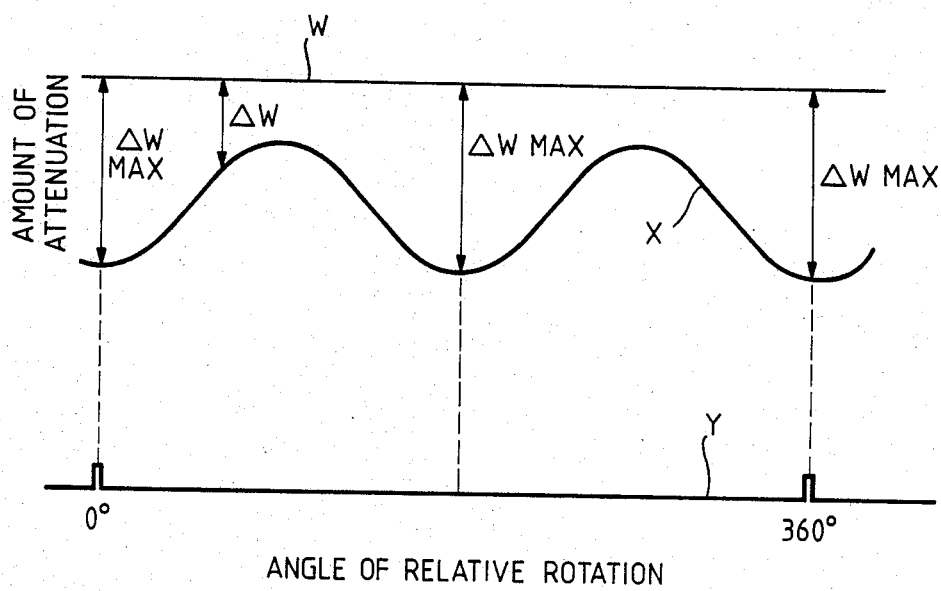
FIG. 5 is a graph showing a microwave attenuation-angle characteristic (orientation) curve, similart to FIG. 2, obtained when wood free paper is measured by the apparatus shown in FIG. 1 or 3.

A sample of wood free paper having a reel air-dry weight of 45 g/m$^2$ and a reel moisture content of 7% from a Fourdrinier machine operating at a running speed of 450 m/min was measured by the fiber orientation measuring apparatus of the present invention shown in FIG. 1. First, the upstream side of longitudinal direction of said sample was made the direction of the reflecting tape 15 (FIG. 1) and then it was rotated at 6 rpm and measured using linearly polarized waves of 3 GHz, whereby a chart as shown in FIG. 5 was obtained. As is clear from FIG. 5, since the direction in which the optical sensor signal Y indicates a peak coincides with the direction in which the amount of attenuation is at a maximum, it was readily ascertained that in the sample in this example the fiber orientation was of longitudinal direction.

Figure 6:
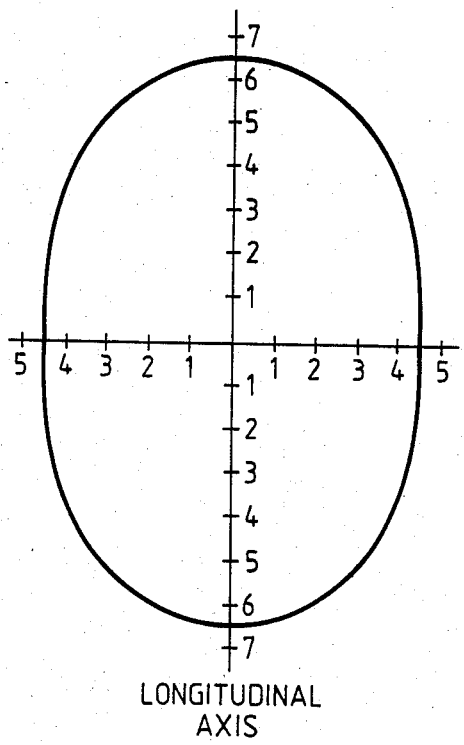
FIG. 6 is a closed curve diagram obtained by converting the orientation curve of FIG. 5 into an X-Y polar coordinate system to indicate amounts of attenuation of microwaves in terms of distances from the origin.

FIG. 6 shows a locus of closed curve described by finding the amounts of attenuation from angle versus voltage values obtained from the chart of FIG. 5 and plotting said values in terms of distances from the origin. This closed curve is a definite ellipse with its major diameter coinciding with the longitudinal axis of the sample and demonstrates the orientation by its disposition.

In the above example, the time needed from obtainment of the sample till determination of the orientation was about 5 minutes. This is a drastic reduction of time as compared with the conventional orientation determining methods, e.g., the zero-span tensile strength method, which takes about 60 minutes. In addition, the aforesaid sample was measured by the apparatus of FIG. 3 rotating at 30 rpm and the result was substantially the same, the time needed being almost the same.

EXAMPLE 2

Figure 7:
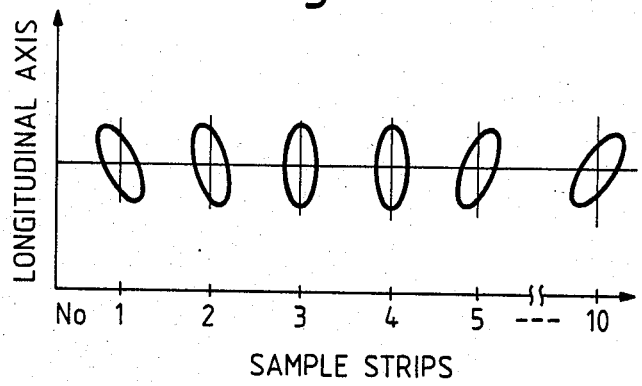
FIG. 7 is an X-Y recorder graph showing the widthwise distribution of orientation of fibers of the same wood free paper.

A sample of 5-m wide wood free paper obtained under the same conditions as in Example 1 was slit along the direction of flow into 10 strips having the same width, which were wound on winder rolls. Such sample was measured by the fiber orientation measuring apparatus constructed as shown in FIG. 4. A paper feed rate of 200 mm/pitch, a stop time of 1 second, and a rotative speed of the reversible motor 19 to provide a waveguide rotative speed of 30 rpm were set in the control section 23. The result obtained was outputted to the X-Y recorder, and for each sample piece a graph substantially similar to FIG. 6 was obtained and the characteristic of fiber orientation over the entire width was observed. The amount of attenuation with respect to each of different angular positions of the sample strip was obtained by optionally selected as an average of the attenuation values measured at optionally selected 10 different length positions. FIG. 7 schematically illustrates the fiber orientations in the 10 slit strips as a result of measurement of attenuation thus conducted.

EXAMPLE 3

Figure 8:
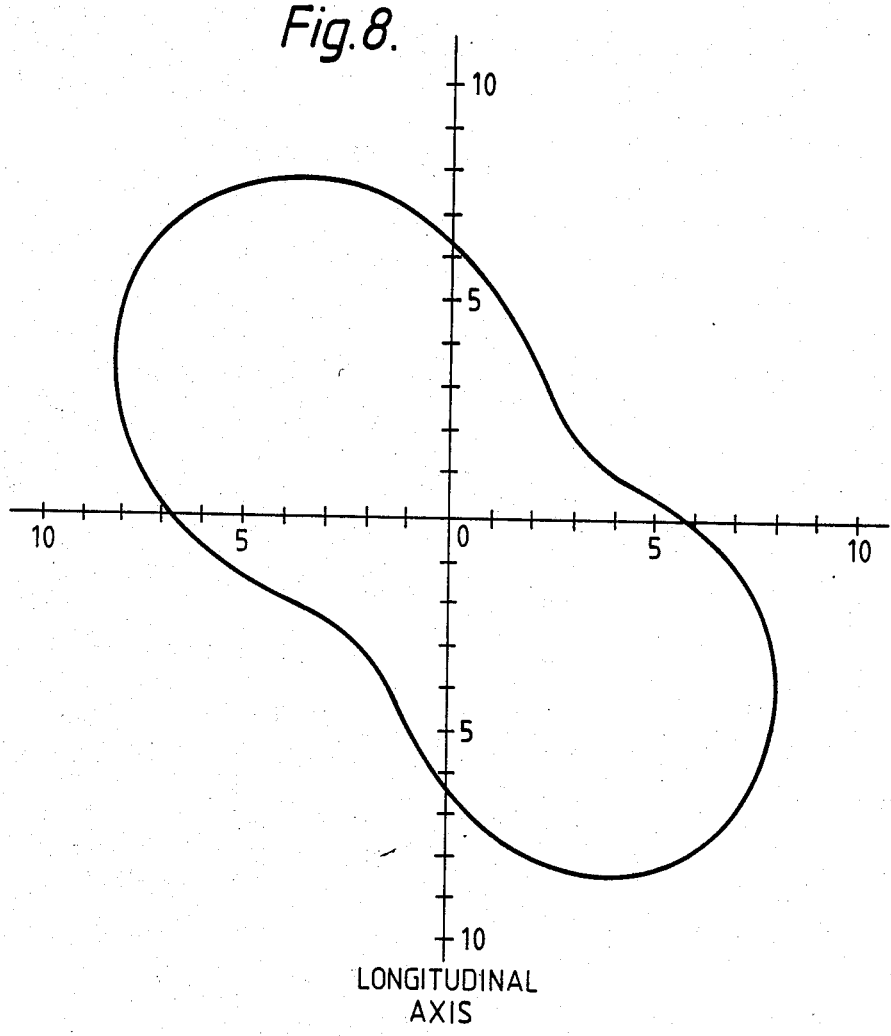
FIG. 8 is a closed curve diagram, similar to FIG. 6, wherein the orientation of the molecules of a polyethylene terephthalate sheet is measured by using the apparatus of FIG. 1 or 3.
Figure 9:
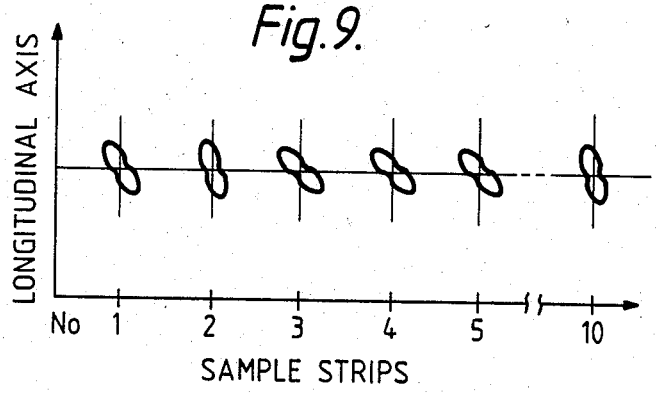
FIG. 9 is an X-Y recorder graph showing the widthwise distribution of orientation of molecules of the polyethylene terephthalate sheet.

A 70-μm thick polyethylene terephthalate sheet sample obtained by stretching with a tenter-method biaxial stretching apparatus was measured by a molecular orientation measuring apparatus constructed in the manner shown in FIG. 1 used in the present invention. The waveguides 1 and 2 used were in the form of a rectangular with an opening size of 58.1 mm×29.1 mm. First, the upstream side of longitudinal direction of said sample was made the direction of the reflecting tape 15 and then the sample was measured using linearly polarized waves of 3.5 GHz while rotating it at 6 rpm. A graph was obtained in which the amount of attenuation for each angle was represented by the distance from the origin, as shown in FIG. 8. As is clear from FIG. 8, since the direction in which the amount of attenuation is at a maximum is a direction reversely turned about 45° from the longitudinal direction, it was readily ascertained that the direction of molecular orientation was a direction turned conterclockwise about 45° from the longtudinal direction. However, the time needed from obtainment of the sample till determination of the orientation was only about 5 minutes.

EXAMPLE 4

A 5-m wide polyethylene terephthalate sheet obtained under the same conditions as in Example 3 was slit along the direction of flow into 10 equal strips to provide elongated samples. Such samples were measured by a molecular orientation measuring apparatus constructed in the manner shown in FIG. 4. A feed rate of 200 mm/pitch, a stop time of 1 second, and a rotative speed of the reversible motor 19 to provide a waveguide rotative speed of 10 rpm were set in the control section 23. FIG. 90 schematically illustrates the molecular orientations in the 10 slit strips measured in the same manner as Example 2.

EXAMPLE 5

A 200-μm alumina silicate sample obtained by the tape casting forming method was measured by the apparatus of the invention constructed in the manner shown in FIG. 3. Waveguides 1 and 2 having the same size and shape as those used in Example 1 were used, and the upstream side of longitudinal direction of said sample was made the direction of the reflecting tape 24 and then the sample was measured using linearly polarized waves of 3.5 GHz while rotating the waveguides 1 and 2 at a rotative speed of 30 rpm. As a result, a graph as shown in FIG. 10 was obtained in which the amount of attenuation for each angle is represented by the distance from the origin. As is clear from FIG. 10, since the direction in which the amount of attenuation is at a maximum coincides with the upward or downward direction of the sample, in the sample in this example it was readily ascertained that the molecular orientation is of longitudinal direction.

As has been described so far, according to the molecular orientation measuring technique of the invention, a checkup of the molecular orientation of sheets can be made extremely easily and in a short-time, making it possible to cope with abnormality during its early stage, so that the occurrence of rejects can be kept to a minimum.

What is claimed is:

1. A method of measuring the orientation of the constituents of web or sheet products by using a cavity resonator composed of a pair of waveguides having in their bottoms a transmitting antenna and a receiving antenna aligned in substantially the same plane, respectively, and opposed at their openings to each other with a small clearance defined therebetween, said method comprising the steps of:

inserting a sample portion of said web or sheet product into said clearance, emitting linearly polarized microwaves from said transmitting antenna toward said open ends to allow them to fall in the surface of said sample portion at right angles thereto while producing a relative motion between the plane of polarization of microwaves and said sample portion around the axis of said cavity resonator, receiving the microwaves guided from the waveguide disposed on the transmitting side via the sample portion in said clearance to the waveguide disposed on the receiving side so as to find the amount of microwaves absorbed by said sample portion, and determining the orientation of the constituent of said web or sheet product from the angular position of said sample portion, where said amount of absorption is at a maximum, relative to said plane of polarization.

2. A method as set forth in claim 1, wherein said web or sheet product is a paper sheet or web.

3. A method as set forth in claim 1, wherein said web or sheet product is a plastic web or sheet.

4. A method as set forth in claim 1, wherein said web or sheet product is a ceramic web or sheet.

5. A method as set forth in claim 1, wherein the sample portion of said web or sheet product is rotated in said small clearance, thereby producing relative rotation between it and said plane of polarization.

6. A method as set forth in claim 1, wherein said sample portion is fixedly supported in said small clearance, while the portion of the cavity including at least the transmitting antenna and receiving antenna is rotated, thereby producing relative rotation between said plane of polarization and said sample portion.

7. A method as set forth in claim 1, wherein the orientation of the constituent of one sample portion is measured during 180° rotation of said cavity resonator, whereupon the web or sheet including this sample portion is advanced one step to insert the subsequent sample portion into said small clearance and the orientation of the constituent of this portion is measured, such operation being repeated.

8. An apparatus for measuring the orientation of the constituents of web or sheet products, comprising:

a cavity resonator composed of a pair of waveguides having in their bottoms a transmitting antenna and a receiving antenna aligned in substantially the same plane, respectively, and opposed at their openings to each other with a small clearance defined between, means whereby a sample portion of a web or sheet product inserted into said clearance is supported around the outer peripheries of said openings, rotatively driving means for rotatively driving either said cavity resonator or said sample portion supporting means around the axis of the former to thereby produce relative rotation therebetween, angle detecting means for detecting, relative to the machine frame, the angular position of the cavity resonator or sample portion rotatively driven by said rotatively driving means, a control section for energizing said transmitting antenna while starting said rotatively driving means in response to a measurement start signal and at the same time associating the intensity of the microwaves intercepted by said receiving antenna with the angular position detected by said angle detecting means so as to display or record it, and means for making said display or record.

9. An apparatus as set forth in claim 8, wherein said rotatively driving means drives said sample portion support means.

10. An apparatus as set forth in claim 8, wherein said rotatively driving means drives said cavity resonator.

11. An apparatus as set forth in claim 8, wherein said sample portion support means consists of a conveyor mechanism for passing a web or sheet through said small clearance, said conveyor mechanism being adapted to feed said web or sheet stepwise so that predetermined sample portions are successively positioned in said small clearance.

* * * * *